(12) United States Patent
Waheed et al.

(10) Patent No.: US 9,484,936 B2
(45) Date of Patent: Nov. 1, 2016

(54) PHASE LOCKED LOOP HAVING FRACTIONAL VCO MODULATION

(71) Applicant: FREESCALE SEMICONDUCTOR, INC., Austin, TX (US)

(72) Inventors: Khurram Waheed, Austin, TX (US); Kevin B. Traylor, Austin, TX (US)

(73) Assignee: FREESCALE SEMICONDUCTOR, INC., Austin, TX (US)

(*) Notice: Subject to any disclaimer, the term of this patent is extended or adjusted under 35 U.S.C. 154(b) by 0 days.

(21) Appl. No.: 14/631,305

(22) Filed: Feb. 25, 2015

(65) Prior Publication Data

US 2016/0248430 A1    Aug. 25, 2016

(51) Int. Cl.

| | |
|---|---|
| H03C 1/00 | (2006.01) |
| H03C 1/12 | (2006.01) |
| H03L 7/099 | (2006.01) |
| H03L 7/081 | (2006.01) |
| H03B 5/12 | (2006.01) |
| H03M 7/16 | (2006.01) |
| H03M 3/00 | (2006.01) |
| H03C 3/09 | (2006.01) |
| H03C 3/00 | (2006.01) |
| H03L 7/197 | (2006.01) |

(52) U.S. Cl.
CPC ............... *H03L 7/099* (2013.01); *H03B 5/124* (2013.01); *H03C 3/00* (2013.01); *H03C 3/0925* (2013.01); *H03C 3/0933* (2013.01); *H03C 3/0941* (2013.01); *H03C 3/0958* (2013.01); *H03C 3/0975* (2013.01); *H03L 7/081* (2013.01); *H03L 7/197* (2013.01); *H03M 3/422* (2013.01); *H03M 7/165* (2013.01)

(58) Field of Classification Search
CPC ........ H03D 3/24; H03C 3/00; H03C 3/0975; H03C 3/0958; H03C 3/0941; H03C 3/0933; H03C 3/0925; H03L 7/099; H03L 7/197; H03L 7/081; H03B 5/124; H03M 7/165; H03M 3/422
USPC .................... 332/128, 127; 375/376; 331/1 A
See application file for complete search history.

(56) References Cited

U.S. PATENT DOCUMENTS

| | | |
|---|---|---|
| 6,294,936 B1 | 9/2001 | Clementi |
| 6,823,033 B2 | 11/2004 | Fahim |

(Continued)

OTHER PUBLICATIONS

Hegazi et al, "Varactor Characteristics, Oscillator Tuning Curves, and AM-FM Conversion", IEEE Journal of Solid-State Circuits, Jun. 2003, pp. 1033-1039, vol. 38, No. 6.

(Continued)

*Primary Examiner* — Arnold Kinkead

(57) ABSTRACT

An integrated circuit comprises a dual port modulator and a voltage controlled oscillator (VCO). The dual port modulator has a first input for receiving a transmitter modulation signal, a first output for providing a fractional portion of a high port modulation signal, a second output for providing a integer portion of the high port modulation signal, and a third output for providing a low port modulation signal. The VCO is coupled to the dual port modulator and has a first input for receiving the fractional portion of the high port modulation signal, a second input for receiving the integer portion of the high port modulation signal, a third input for receiving a tuning signal based on the low port modulation signal, and a first output for outputting an RF signal. The dual port modulator provides a signed single bit signal for generating the fractional portion of the high port modulation signal.

20 Claims, 5 Drawing Sheets

(56) References Cited

U.S. PATENT DOCUMENTS

| | | | |
|---|---|---|---|
| 6,856,791 | B2 | 2/2005 | Klemmer |
| 7,046,098 | B2 | 5/2006 | Staszewski |
| 7,439,817 | B2 | 10/2008 | Waheed et al. |
| 7,570,182 | B2 | 8/2009 | Sheba et al. |
| 7,772,900 | B2 | 8/2010 | Ainspan et al. |
| 7,786,913 | B2 | 8/2010 | Waheed et al. |
| 7,843,730 | B2 | 11/2010 | Syzdek |
| 7,920,081 | B2 | 4/2011 | Waheed et al. |
| 8,045,670 | B2 | 10/2011 | Waheed et al. |
| 8,536,916 | B1 | 9/2013 | Van Engelen et al. |
| 2006/0170511 | A1 | 8/2006 | Dunworth |
| 2007/0035354 | A1 | 2/2007 | Chan et al. |
| 2009/0141845 | A1* | 6/2009 | Ballantyne ............ H03L 7/085 375/376 |
| 2009/0195275 | A1 | 8/2009 | Friedman et al. |
| 2010/0231310 | A1 | 9/2010 | Wang et al. |
| 2011/0298506 | A1* | 12/2011 | Salle .................. G01S 7/032 327/156 |

OTHER PUBLICATIONS

Staszewski et al, "Spur-Free Multirate All-Digital PLL for Mobile Phones in 65 nm CMOS", IEEE Journal of Solid-State Circuits, Dec. 2011, pp. 2904-2919, vol. 46, No. 12.

Yang et al, "Phase-Rotator-Based All-Digital Phase-Locked Loop for a Spread-Spectrum Clock Generator", IEEE Transactions on Circuits and Systems—II: Express Briefs, Nov. 2014, pp. 880-884, vol. 61, No. 11.

Bunch et al, "Large-Signal Analysis of MOS Varactors in CMOS—Gm LC VCOs", IEEE Journal of Solid State Circuits, Aug. 2003, pp. 1325-1332, Vol, 38, No. 8.

Zhuang et al, "Design of Spur-Free S? Frequency Tuning Interface for Digitally Controlled Oscillators", IEEE Transactions on Circuits and Systems II: Express Briefs, Oct. 14, 2014, pp. 46-50, vol. 65, Issue 1.

Barrett, "Fractional/Integer-N PLL Basics" Texas Instruments Technical Brief SWRA029, Aug. 1999, pp. 1-55.

Extended European Search Report dated Jun. 23, 2016 in EP Application No. 16155022.3.

* cited by examiner

| HIGH PORT FRACTIONAL MODULATOR OUTPUT | THERMOMETRIC CODE | VCO FREQUENCY CHANGE (KHz) |
|---|---|---|
| −1 | 00 | NO FREQUENCY CHANGE |
| 0 | 01 OR 10 | + ONE LSB FREQUENCY STEP |
| 1 | 11 | + TWO LSB FREQUENCY STEP |

PHASE LOCKED LOOP HAVING FRACTIONAL VCO MODULATION

BACKGROUND

1. Field

This disclosure relates generally to phase locked loops, and more specifically, to a phase locked loop having a fractional voltage controlled oscillator (VCO) modulation.

2. Related Art

A radio frequency (RF) transceiver may be integrated in a system-on-a-chip (SoC) with an embedded controller or processor and other peripherals. The SoC may be for use in smart home, life, sensors, etc. in a market segment sometimes referred to as the internet of things (IOTs). There are a variety of transmitter and receiver architectures for use in an RF transceiver. The RF transceiver may include a PLL. Also, operation of the transceiver may require that the PLL be modulated. One technique for modulating the PLL is commonly known as dual port modulation. In dual port modulation, the input signal is split into a low port modulation and a high port modulation. The low port modulation is provided to a loop filter of the PLL and the high port modulation is applied to a bank of varactors used in a VCO tank circuit. The bank of varactors may be realized as a bank of finely quantized digitally switchable capacitors (varactors), or as a varactor that is controlled by a digital-to-analog converter (DAC).

The bank of varactors may include a plurality of same sized switchable capacitors. Also, the bank of varactors may include a plurality of different sized switchable capacitors, where the size of each of the capacitors corresponds to a bit position of the capacitor. In addition, varactors may include a combination of same sized and different sized switchable capacitors. Hybrid/segmented banks of varactors can be used as well. The amplitude of the high port modulation may be scaled for a least significant bit (LSB) sized varactor. To achieve finer modulation fidelity for the high port modulation, fractional modulation techniques using sigma-delta modulators to control the LSB sized varactors. However, conventional techniques for controlling multiple varactors can result in size mismatch, delay mismatch, and rise-fall timing skew between multiple sigma-delta modulation tuning bits. Also, low power, low cost, connectivity standards such as Bluetooth LE, ANT, and custom FSK/GFSK, GMSK modes do not impose modulation data whitening requirements that potentially may result in a transmission of a long sequence of ones and zeros. For a PLL high port sigma-delta modulator that executes on an interpolated frequency, this implies a DC stimulus for an extended period of time, resulting in idle tones at the sigma-delta modulator's output that causes undesirable modulated RF output/spurs. Therefore, a need exists for a PLL that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
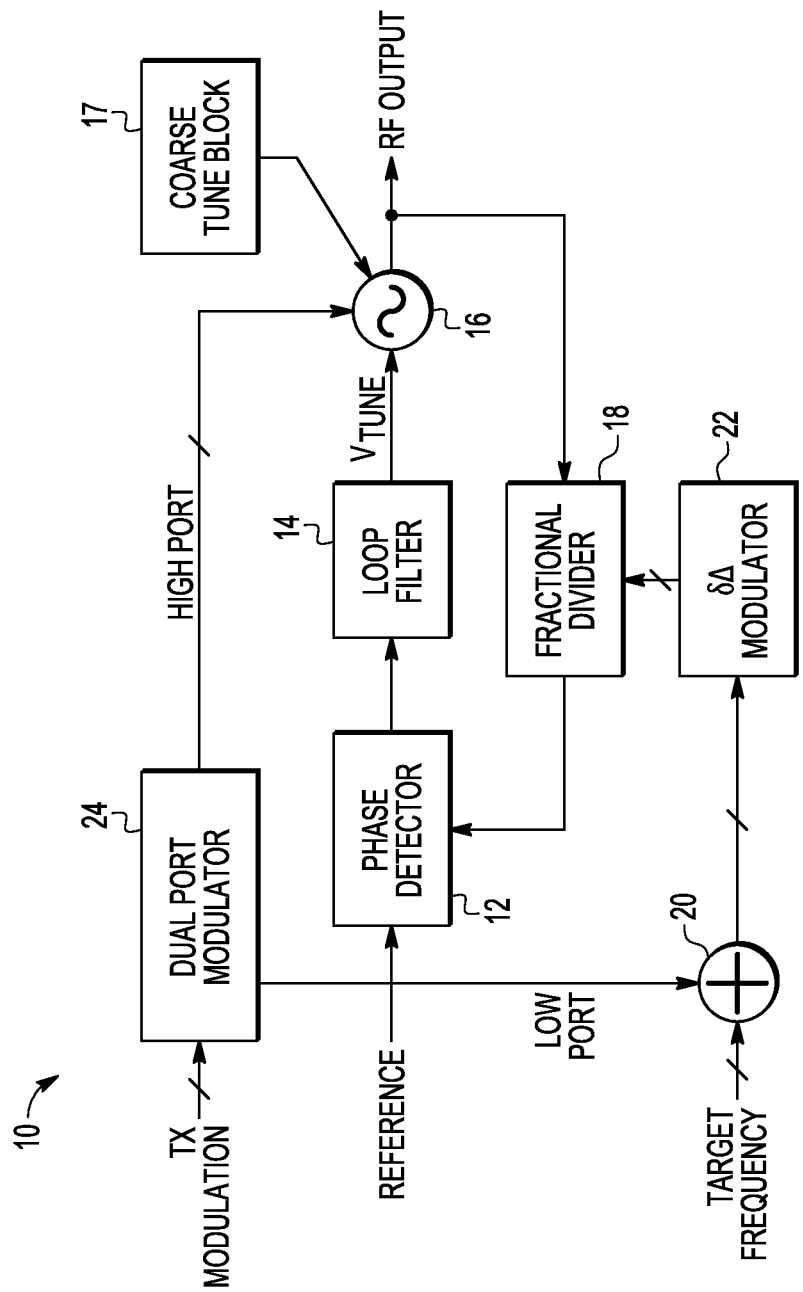
FIG. 1 illustrates, in block diagram form, a PLL in accordance with an embodiment.

Generally, there is provided, a PLL with dual port modulation. In the dual port modulation, an input modulation signal is split into a high port modulation portion and a low port modulation portion. The high port modulation having a high port integer portion and a high port modulation fractional portion. A high port fractional modulator includes a sigma-delta modulator for providing the high port fractional portion. The sigma-delta modulator has a single signed-bit output. The single signed bit output is coupled to a binary-to-thermometric converter. The binary-to-thermometric converter is used for tuning a bank of varactors in a VCO of the PLL. Using a sigma-delta modulator with a single signed-bit output coupled to a binary-to-thermometric converter reduces spurious content due to VCO varactor and signal routing mismatches. Also, to mitigate idle tones that can occur in modulation if a long string of ones or zeros are modulated, a dithering circuit may be implemented with the sigma-delta modulator.

In one embodiment, there is provided, an integrated circuit comprising: a dual port modulator having a first input for receiving a transmitter modulation signal, a first output for providing a fractional portion of a high port modulation signal, a second output for providing an integer portion of the high port modulation signal, and a third output for providing a low port modulation signal; a voltage controlled oscillator (VCO) coupled to the dual port modulator, the VCO having a first input for receiving the fractional portion of the high port modulation signal, a second input for receiving the integer portion of the high port modulation signal, a third input for receiving a tuning signal based on the low port modulation signal, and a first output for outputting an RF signal; and wherein a signed single bit signal is used for generating the fractional portion of the high port modulation signal. The fractional portion of the high port modulation signal may be applied to the VCO at a higher clock rate than the integer portion of the high port modulation signal. The dual port modulator may comprise a high port fractional modulator for producing the signed single bit signal used for generating the fractional portion of the high port modulation signal. The dual port modulator may further comprise an integer fraction splitter circuit for receiving the high port modulation signal, for providing a first signal to the high port fractional modulator for generating the fractional portion of the high port modulation signal, and for providing a second signal for generating the integer portion of the high port modulation signal. The dual port modulator may further comprise a binary to thermometric converter coupled to the high port fractional modulator for converting the signed single bit signal into a thermometric digital code for producing the high port modulation signal. The high port fractional modulator may comprise a second order or higher sigma-delta modulator. The high port fractional modulator may further comprise a quantizer coupled to the second order or higher sigma-delta modulator for producing the signed single bit signal. The integrated circuit may further comprise a zero-mean dithering circuit coupled to the second order or higher sigma-delta modulator for mitigating idle tones in modulation. The signed single bit signal of the quantizer may provide three signed states which are mapped to two thermometric varactors in the VCO.

In another embodiment, there is provided, a method of modulation comprising: receiving a fractional portion of a high port modulation signal at a first input of a voltage controlled oscillator (VCO), the fractional portion of the high port modulation signal based on a signed single bit signal; receiving an integer portion of the high port modulation signal at a second input of the VCO; receiving a VCO tuning signal at a third input of the VCO; and generating an RF signal at an output of the VCO. The method may further comprise generating the fractional portion of a high port modulation signal at a first output of a dual port modulator and generating the integer portion of the high port modulation signal at a second output of the dual port modulator. The method may further comprise generating, with an integer fraction splitter receiving the high port modulation signal, a first output signal and a second output signal based on the high port modulation signal. The method may further comprise receiving the first output signal at a high port fractional modulator, the high port fractional modulator generating the signed single bit signal. The method may further comprise receiving the signed single bit signal at a binary-to-thermometer code converter, and converting the signed single bit signal to a thermometric coded signal, the thermometric coded signal being characterized as the fractional portion of the high port modulation signal and provided to the first input of the VCO. The method may further comprise generating the high port modulation signal by mixing a transmitter modulation signal with a calibration signal. The method may further comprise generating the integer portion of the high port modulation signal by delaying the second output signal such that the integer portion of the high port modulation signal is aligned with the fractional portion of the high port modulation signal. The step of receiving the first output signal at a high port fractional modulator may comprise dithering the first output signal. The method may further comprise generating a low port modulation signal with a sigma delta modulator, the sigma delta modulator receiving a signal comprising mixing a target frequency signal with a low port signal output at a third output of the dual port modulator, the tuning signal being based on the low port modulation signal.

In yet another embodiment, there is provided, an integrated circuit comprising: a voltage controlled oscillator (VCO) for generating an RF signal, the VCO having a first input for receiving a fractional portion of a high port modulation signal, a second input for receiving an integer portion of the high port modulation signal, a third input for receiving a tuning signal; and a dual port modulator coupled to the VCO, the dual port modulator for receiving a transmitter modulation signal and for providing modulation signals to the VCO, the dual port modulator receiving the transmitter modulation signal at a first input, providing at a first output the fractional portion of the high port modulation signal based on a signed single bit signal, providing the integer portion of the high port modulation signal at a second output, and providing a low port modulation signal at a third output; and wherein the fractional portion of the high port modulation signal is based on a signed single bit signal. The tuning signal may be based on a low port modulation signal.

FIG. 1 illustrates, in block diagram form, a PLL 10 in accordance with an embodiment. Phase locked loop 10 includes phase detector 12, loop filter 14, VCO 16, coarse tune block 17, fractional divider 18, adder 20, sigma-delta modulator 22, and dual port modulator 24. Phase detector 12 has a first input for receiving a reference clock signal labeled "REFERENCE", a second input for receiving a feedback signal from fractional divider 18, and an output coupled to an input of loop filter 14. Voltage controlled oscillator 16 has a first input coupled to an output of loop filter 14 for receiving a VCO tuning signal labeled "VTUNE", a second input coupled to an output of dual port modulator 24 for receiving a high port modulation tuning signal labeled "HIGH PORT", and an output for providing an RF output signal labeled "RF OUTPUT". Fractional divider 18 has an input coupled to the output of VCO 16, and an output coupled to the second input of phase detector 12. Adder 20 has a first input coupled to receive a frequency band selection signal labeled "TARGET FREQUENCY", a second input coupled to an output of dual port modulator 24, and an output coupled to an input of sigma-delta modulator 22. Sigma-delta modulator 22 has an output coupled to an input of fractional divider 18. Dual port modulator 24 has an input coupled to receive a transmit modulation signal labeled "TX MODULATION". Note that FIG. 1 provides a simplified view of the circuit blocks that make up PLL 10. With respect to VCO 16, additional signals will be illustrated in FIG. 5 that are not shown in FIG. 1.

In the illustrated embodiment, PLL 10 includes both digital and analog circuitry. In other embodiments, PLL 10 may be characterized as either an analog PLL or a digital PLL and the concepts discussed herein will be equally applicable to both. Generally, PLL 10 operates as a conventional PLL. That is, a feedback signal is compared to a reference frequency signal in phase detector 12. In response, phase detector 12 provides a control voltage for adjusting the output frequency of VCO 16 after being filtered by loop filter 14, and provided by loop filter 14 as VCO tuning signal VTUNE. A VCO band selection signal from coarse tune block 17 is provided as a separate input which is applied to an open loop VCO to drive the RF output frequency close to (within a few megahertz) of the TARGET FREQUENCY. Voltage controlled oscillator 16 also receives tuning signal HIGH PORT from dual port modulator 24. In addition, dual port modulator 24 provides tuning signal LOW PORT to adder 20. Adder 20 combines tuning signal LOW PORT with the desired PLL frequency given by TARGET FREQUENCY and provides the resulting output to adjust sigma-delta modulator 22 for the selected frequency band. Sigma-delta modulator 22 provides a signal for setting fractional divider 18 for the selected frequency band. Together tuning signals VTUNE and HIGH PORT adjust the output frequency of output signal RF OUTPUT. The adjusted output signal RF OUTPUT is fed back to phase detector 12 through fractional divider 18. In one embodiment, fractional divider 18 is a programmable multi-modulus divider controlled by sigma-delta modulator 22. Using fractional divide values provides a PLL with higher resolution. In one embodiment, sigma-delta modulator is characterized as being a third-order sigma-delta modulator. In other embodiments, sigma-delta modulator 22 may be a different type of fractional modulator.

In one embodiment, VCO 16 can be implemented as a conventional negative transconductance metal-oxide semiconductor (MOS) inductive-capacitive (LC) oscillator circuit. The LC oscillator includes one or more banks, or arrays, of varactors (variable reactors) for tuning VCO 16 with respect to frequency (not shown). In one embodiment, a varactor in a bank of varactors is implemented as a capacitor and a switch. In another embodiment, a variable capacitance of a varactor is controlled using a control voltage. Alternately, a varactor may be implemented differently. In accordance with the described embodiment, a size, or capacitance value, of each varactor in a bank of varactors is based on a binary weighting, or bit position in the bank. For example, a least significant bit (LSB) position would have a smaller, or smallest, sized capacitor, and a most significant bit (MSB) position would have a larger, or largest, sized capacitor. In another embodiment, all of the varactors in a bank may be sized similarly. In yet another embodiment, the change in capacitance is a function of a change in the control voltage supplied to a single varactor.

Figure 2:
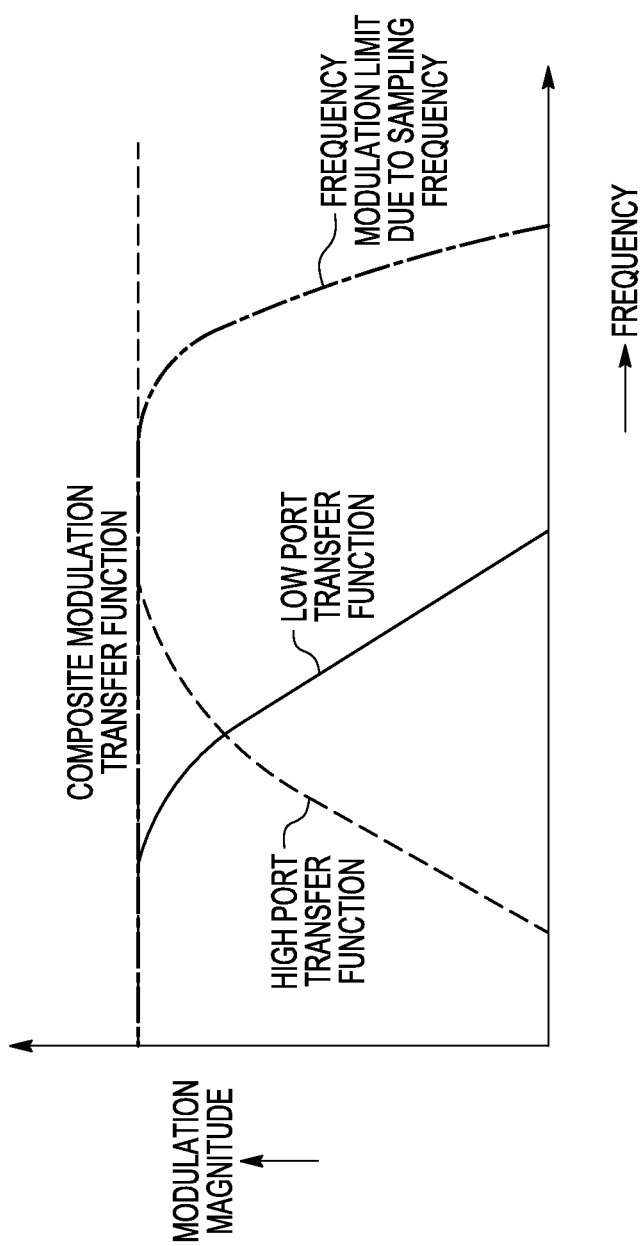
FIG. 2 illustrates a waveform diagram of low port and high port transfer functions for the dual port modulator of FIG. 1.

FIG. 2 illustrates a waveform diagram of low port and high port transfer functions for the dual port modulator of FIG. 1. The waveform illustrates the transfer function magnitudes versus frequency. In FIG. 2, the high port transfer function is shown by the single dashed line. The low port transfer function is represented using the solid line. The frequency modulation limit due to sampling frequency is represented by the double dashed line. The composite modulation transfer function is a composite of the low port transfer function and the high port transfer function and is illustrated as a horizontal straight line.

Figure 3:
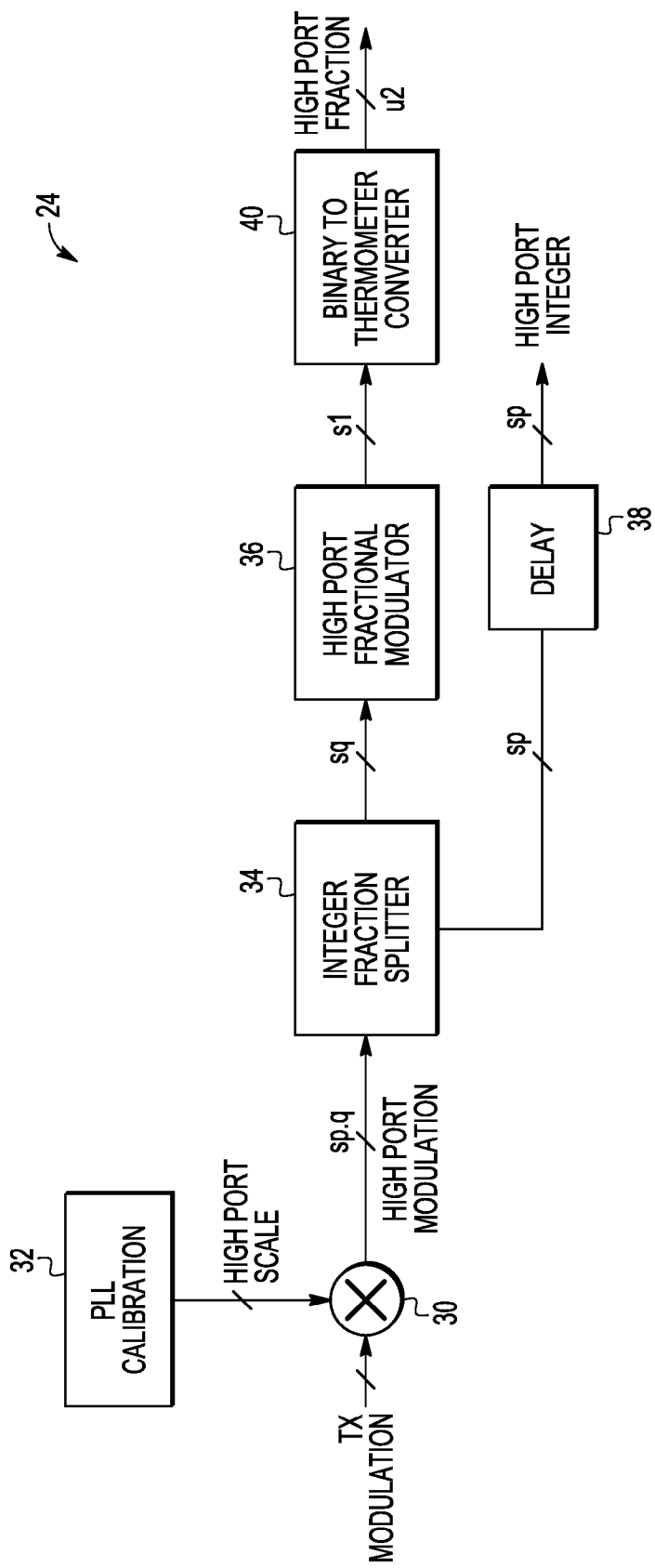
FIG. 3 illustrates, in block diagram form, a high port modulation portion of the dual port modulator of FIG. 1 in more detail.
Figures 5, 6:
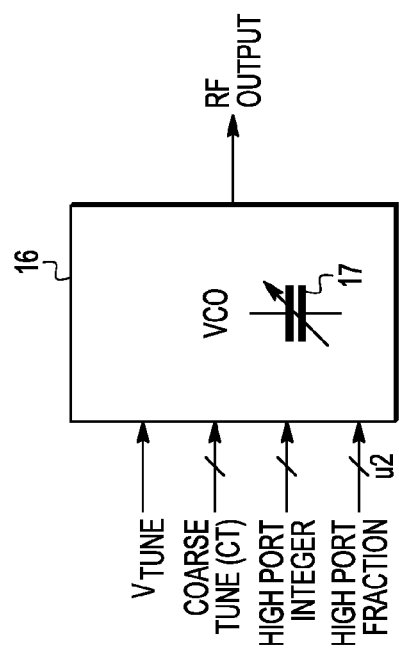
FIG. 5 illustrates, in block diagram form, the various signals provided to the voltage controlled oscillator of FIG. 1 in more detail.
FIG. 6 illustrates a table of thermometric codes used to map signed high port fractional modulator values to a discrete set of LSB varactors.

FIG. 3 illustrates, in block diagram form, a high port modulation portion of the dual port modulator of FIG. 1 in more detail. Dual port modulator 24 includes multiplier 30, PLL calibration block 32, integer fraction splitter 34, high port fractional modulator 36, delay 38, and binary-to-thermometer converter 40. Multiplier 30 has a first input for receiving input signal TX MODULATION, a second input for receiving a scaling signal labeled "HIGH PORT SCALE", and an output for providing a high port modulation signal labeled "HIGH PORT MODULATION". A hashed connection in FIG. 3 indicates that the value being conducted between blocks has multiple bits. An arrowhead indicates the direction the value is transmitted. An "s" by the hash mark indicates that the value is signed, and a "u" by the hash mark indicates that the value is unsigned. Also, a variable "p" indicates that the conducted value has p integer bits, and a variable "q" indicates the conducted value has q fractional bits. For example, a connection labeled with a "sp.q" indicates a signed value with p integer bits and q fractional bits. Integer fraction splitter 34 has an input for receiving the HIGH PORT MODULATION signal, a first output coupled to an input of high port fractional modulator 36, and a second output coupled to an input of delay 38. Delay 38 has an output for providing an integer portion of HIGH PORT MODULATION signal labeled "HIGH PORT INTEGER". Binary-to-thermometer converter 40 has an input coupled to the output of high port fractional modulator 36, and an output for providing a fractional portion of HIGH PORT MODULATION signal labeled "HIGH PORT FRACTION". High port fractional modulator 36 performs fractional modulation using a digital $2^{nd}$-order multi-bit MASH sigma-delta modulator, which converts a multi-bit binary fractional part to three signed single-bit states (−1, 0, +1). These signed states are mapped to two thermometric LSB varactors (not shown). FIG. 6 illustrates a table of unsigned two-bit thermometric output codes that correspond to the signed one-bit high port fractional modulator input values. Together, HIGH PORT INTEGER value provided by delay 38 and HIGH PORT FRACTION value provided by converter 42 comprise the complete HIGH PORT signal illustrated in FIG. 1. In an alternate configuration, the signed p bit (Sp) of the HIGH PORT INTEGER signal might need to be processed by an encoding stage if the high port integer bank has been realized using a hybrid or segmented architecture.

The HIGH PORT FRACTION value is used to drive a high port modulation bank of varactors in VCO 16 of FIG. 1 as describe above with reference to an LC oscillator having varactor banks. In one embodiment, the high port bank of varactors is a plurality of very finely quantized digitally switchable varactors with a capacitance in atto-Farads and a frequency resolution in kilo Hertz. The high port modulation includes an integer bank (either thermometric, binary addressable, or segmented) and a set of LSB (least significant bit) varactors (not shown) for sigma-delta modulation. Integer modulation by, for example, a variable p, turns on an equivalent number of LSB varactors for a sample input time period determined by a reference clock. Fractional modulation is applied at a higher clock rate and turns on an LSB size varactor for part of the reference clock time period, such that the time average over the reference clock period equals the fractional value. In one embodiment, the higher clock rate of the fractional modulation is two times higher than the reference clock rate.

Figure 4:
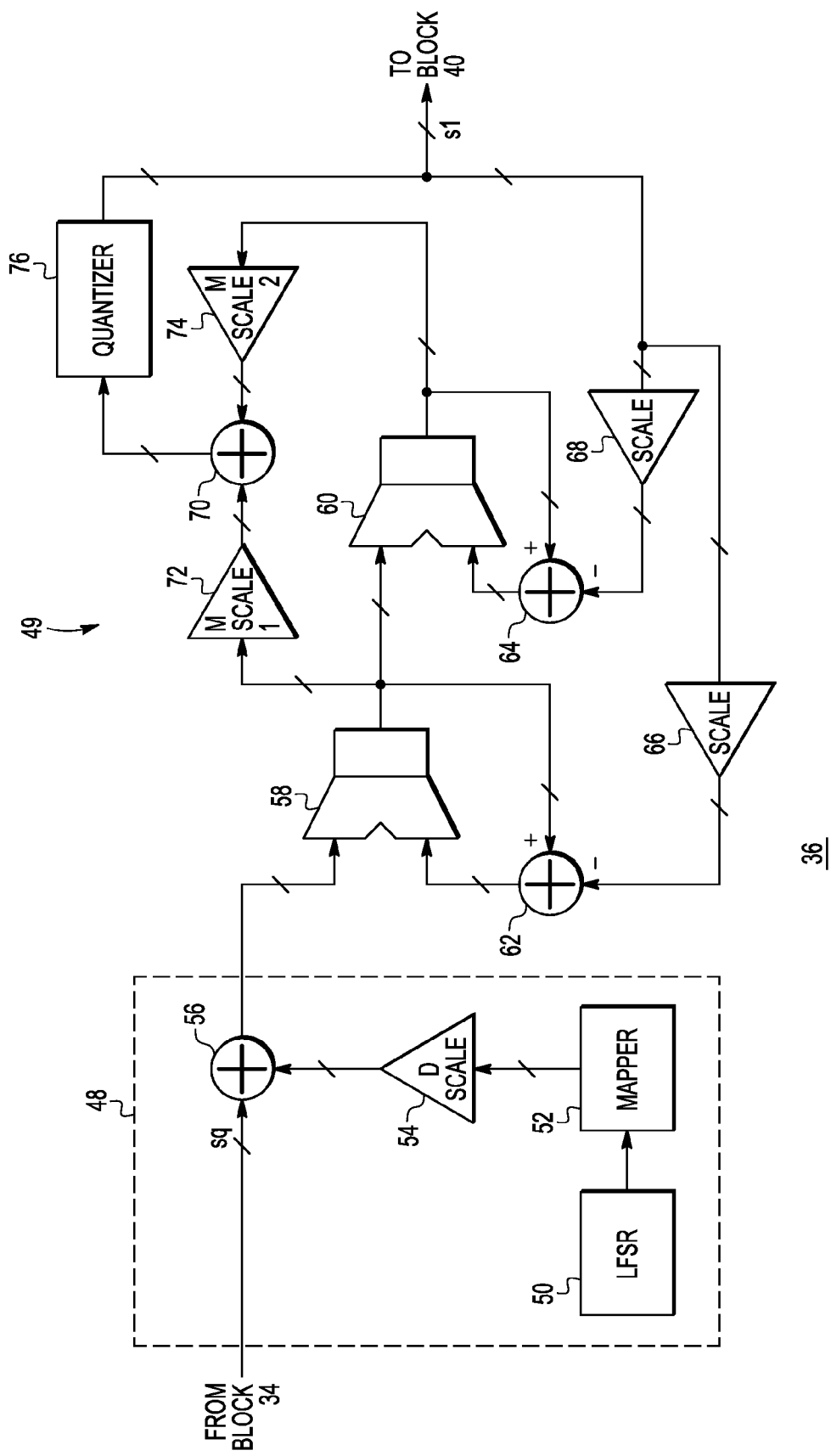
FIG. 4 illustrates, in block diagram form, the high port fractional modulator of FIG. 3 in more detail.

FIG. 4 illustrates, in block diagram form, the high port fractional modulator 36 of FIG. 3 in more detail. High port fractional modulator 36 includes a dither circuit 48 and a second order sigma-delta modulator 49. The high port fractional modulation applies a scaling to the PLL frequency modulation command that maps the instantaneous digital frequency modulation command with low port modulation sigma-delta LSB resolution to the high port modulation varactor bank LSB size. Dither circuit 48 includes mapping circuit 52, linear feedback shift register (LFSR) 50, scaling circuit 54, and summation circuit 56. In dithering circuit 48, LFSR 50 has an output coupled to an input of mapping circuit 52. Mapping circuit 52 has an output coupled to an input of scaling circuit 54. Mapping circuit 52 provides a unipolar to bipolar transformation of the output from LFSR 50. Scaling circuit 54 has an output coupled to an input of summation circuit 56 for providing a dithering component to be summed with the signal from integer fraction splitter 34 (FIG. 3) to improve spectral characteristics of fractional modulator 36. If enabled, dithering is continuously applied, whether the modulation data is varying or comprised of either a string of zeros or a string of ones. Dithering is accomplished by adding a long LFSR sequence (e.g. 17 bits or more, chosen as a function of the dither clock (not shown) and a set of varying or repeating modulation symbols) to the sigma-delta modulation input. Using LFSR based sigma-delta dithering essentially introduces an additive randomized insignificant magnitude modulation to the sigma-delta input. The dithering avoids modulation path idle tones due to a string of the same modulation symbol being transmitted by introducing a randomized dither that is added to the fractional sigma-delta modulator 49. The dithering is insignificant enough to not cause spectral degradation of PLL modulation. Other embodiments may not include dithering as provided by dither circuit 48.

Modulator 36 includes accumulators 58 and 60, summation circuits 62, 64, and 70, scaling circuits 66, 68, 72, and 72, and quantizer 76. Accumulator 58 has a first input coupled to the output of summation circuit 56, a second input, and an output. Accumulator 60 has a first input coupled to the output of accumulator 58, a second input, and an output. Summation circuit 62 has a first input coupled to the output of accumulator 58, a second input, and an output coupled to the second input of accumulator 58. Summation circuit 64 has a first input coupled to the output of accumulator 60, a second input, and an output coupled to the second input of accumulator 60. Scaling circuit 66 has an input coupled to an output of quantizer 76, and an output coupled to the second input of summation circuit 62. Scaling circuit 68 has an input coupled to the output of quantizer 76, and an output coupled to the second input of summation circuit 64. Scaling circuits 66 and 68 represent a maximum value that the input of modulator 36 can receive. Scaling circuit 72 has an input coupled to the output of accumulator 58, and an output. Scaling circuit 74 has an input coupled to the output of accumulator 60, and an output. In the illustrated embodiment, scaling circuits 72 and 74 have a scale factor of ½. In other embodiments, the scale factor may be different. Also, in other embodiments, the scale factor can be either fixed or programmable. Changing the scale factor value is similar to changing the resolution of the sigma-delta modulator resolution. Summation circuit 70 has a first input coupled to the output of scaling circuit 72, a second input coupled to the output of scaling circuit 74, and an output. The output of summation circuit 70 has multiple bits. Quantizer 76 has an input coupled to the output of summation circuit 70, and an output coupled to the input of binary-to-thermometer converter 40 (FIG. 3). Quantizer 76 converts the multiple bit output signal from summation circuit 70 to a single signed value. In the illustrated embodiment, the output of quantizer 76 is either −1, 0, or +1. For most of the time, the output of quantizer 76 changes by 1 state or less, which removes a number of physical sigma-delta implementation artifacts caused by size, delay skew, and a possible mismatch between rise and fall times between a multiple bit sigma-delta output. The sigma-delta output range is symmetric and does not introduce a bias in the dithered fractional value. Note that although a second order sigma-delta modulator is described, one skilled in the art will be able to extend the described approach to higher order sigma-delta modulators.

FIG. 5 illustrates, in block diagram form, the various signals provided to the voltage controlled oscillator of FIG. 1 in more detail. VCO 16 has an input for receiving a VCO tuning signal labeled "VTUNE", an input for receiving a coarse tuning signal labeled "COARSE TUNE", an input for receiving the HIGH PORT INTEGER value from delay 38 illustrated in FIG. 3, an input for receiving the HIGH PORT FRACTION value illustrated in FIG. 3, and an output labeled "RF OUTPUT". VCO 16 includes one or more banks of varactors 17.

FIG. 6 illustrates a table of thermometric codes used to map signed high port fractional modulator values to a discrete set of LSB varactors. The high port fractional modulator output is determined by VCO frequency and may change in response to frequency changes when the VCO is, for example, locked. During PLL wake-up and operation in the absence of modulation, the fractional modulator output is 0, which is mapped to having one LSB varactor permanently enabled. When a fractional modulation of the high port modulator bank is enabled, the fractional modulator can have three signed states, where the frequency can either go up, stay the same, or go down. For example, if the VCO frequency is not changing, the high port fractional modulator output provides a fixed signed single-bit value such as 0, and the binary-to-thermometer converter will convert the 0 to an unsigned two-bit value 01 (or 10) as illustrated in the second row of the table of FIG. 6. If the modulation reduces the VCO frequency by a fractional amount of one LSB frequency step, the output may be −1 with a corresponding thermometric code of 00 (first row). If the modulation increases VCO frequency changes by a fractional amount of one LSB frequency step, the fractional modulator output may be +1 with a corresponding thermometric code of 11 (i.e., two LSB frequency steps as illustrated in the third row). In other embodiments, the values in the table may be different and may be a function of the specific VCO implementation. That is, the mapping may depend on the type of devices used and how the devices that comprise the modulation tank circuit are connected together. For example, the binary-to-thermometer converter may convert the −1 to an unsigned two-bit value 11, the 0 may convert to 01 or 10, and the +1 may convert to 00. Note that a signed single-bit signal is equivalent to an unsigned 2-bit signal and in this case has three states (−1, 0, +1).

Using a sigma-delta modulator with a single signed-bit output coupled to a binary-to-thermometric converter as described above reduces spurious content due to VCO varactor and signal routing mismatches.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit comprising:
   a dual port modulator having a first input for receiving a transmitter modulation signal, a first output for providing a fractional portion of a high port modulation signal, a second output for providing an integer portion of the high port modulation signal, and a third output for providing a low port signal, the fractional portion of the high port modulation signal generated using a signed single bit signal;
   a sigma delta modulator to generate a low port modulation signal, the sigma delta modulator having an input for receiving a signal comprising a mix of a target frequency signal with the low port signal, and an output for providing the low port modulation signal;

a voltage controlled oscillator (VCO) coupled to the dual port modulator, the VCO having a first input for receiving the fractional portion of the high port modulation signal, a second input for receiving the integer portion of the high port modulation signal, a third input for receiving a tuning signal based on the low port modulation signal, and a first output for outputting an RF signal.

2. The integrated circuit of claim 1, wherein the fractional portion of the high port modulation signal is applied to the VCO at a higher clock rate than the integer portion of the high port modulation signal.

3. The integrated circuit of claim 1, wherein the dual port modulator comprises a high port fractional modulator for producing the signed single bit signal used for generating the fractional portion of the high port modulation signal.

4. The integrated circuit of claim 3, wherein the dual port modulator further comprises an integer fraction splitter circuit for receiving the high port modulation signal, for providing a first signal to the high port fractional modulator for generating the fractional portion of the high port modulation signal, and for providing a second signal for generating the integer portion of the high port modulation signal.

5. The integrated circuit of claim 3, wherein the dual port modulator further comprises a binary to thermometric converter coupled to the high port fractional modulator for converting the signed single bit signal into a thermometric digital code for producing the high port modulation signal.

6. The integrated circuit of claim 3, wherein the high port fractional modulator comprises a second order or higher sigma-delta modulator.

7. The integrated circuit of claim 6, wherein the high port fractional modulator further comprises a quantizer coupled to the second order or higher sigma-delta modulator for producing the signed single bit signal.

8. The integrated circuit of claim 6, further comprising a zero-mean dithering circuit coupled to the second order or higher sigma-delta modulator for mitigating idle tones in modulation.

9. The integrated circuit of claim 7, wherein the signed single bit signal of the quantizer provides three signed states which are mapped to two thermometric varactors in the VCO.

10. A method of modulation comprising:
receiving a fractional portion of a high port modulation signal at a first input of a voltage controlled oscillator (VCO), the fractional portion of the high port modulation signal based on a signed single bit signal;
receiving an integer portion of the high port modulation signal at a second input of the VCO;
receiving a VCO tuning signal at a third input of the VCO;
generating a low port modulation signal with a sigma delta modulator, the sigma delta modulator receiving a signal comprising mixing a target frequency signal with a low port signal output at a third output of the dual port modulator, the VCO tuning signal based on the low port modulation signal; and
generating an RF signal at an output of the VCO.

11. The method of claim 10, further comprising generating the fractional portion of a high port modulation signal at a first output of a dual port modulator and generating the integer portion of the high port modulation signal at a second output of the dual port modulator.

12. The method of claim 11, further comprising generating, with an integer fraction splitter receiving the high port modulation signal, a first output signal and a second output signal based on the high port modulation signal.

13. The method of claim 12, further comprising receiving the first output signal at a high port fractional modulator, the high port fractional modulator generating the signed single bit signal.

14. The method of claim 13, further comprising receiving the signed single bit signal at a binary-to-thermometer code converter, and converting the signed single bit signal to a thermometric coded signal, the thermometric coded signal being characterized as the fractional portion of the high port modulation signal and provided to the first input of the VCO.

15. The method of claim 12, further comprising generating the high port modulation signal by mixing a transmitter modulation signal with a calibration signal.

16. The method of claim 12, further comprising generating the integer portion of the high port modulation signal by delaying the second output signal such that the integer portion of the high port modulation signal is aligned with the fractional portion of the high port modulation signal.

17. The method of claim 13, wherein receiving the first output signal at a high port fractional modulator comprises dithering the first output signal.

18. An integrated circuit comprising:
a voltage controlled oscillator (VCO) for generating an RF signal, the VCO having a first input for receiving a fractional portion of a high port modulation signal, a second input for receiving an integer portion of the high port modulation signal, a third input for receiving a tuning signal;
a dual port modulator coupled to the VCO, the dual port modulator for receiving a transmitter modulation signal and for providing modulation signals to the VCO, the dual port modulator receiving the transmitter modulation signal at a first input, providing at a first output the fractional portion of the high port modulation signal based on a signed single bit signal, providing the integer portion of the high port modulation signal at a second output, and providing a low port signal at a third output; and
a sigma delta modulator to generate a low port modulation signal, the sigma delta modulator having an input for receiving a signal comprising a mix of a target frequency signal with the low port signal, and an output for providing the low port modulation signal, the tuning signal based on the low port modulation signal.

19. The method of claim 18, wherein the RF signal is based on the tuning signal received at the VCO.

20. The integrated circuit of claim 18, wherein the dual port modulator comprises a high port fractional modulator for producing the signed single bit signal used for generating the fractional portion of the high port modulation signal.

* * * * *